United States Patent
Lee et al.

(10) Patent No.: US 12,482,755 B2
(45) Date of Patent: Nov. 25, 2025

(54) SEMICONDUCTOR DEVICE AND METHOD OF MAKING AN INTERCONNECT BRIDGE WITH INTEGRATED PASSIVE DEVICES

(71) Applicant: STATS ChipPAC Pte. Ltd., Singapore (SG)

(72) Inventors: YongTaek Lee, Seoul (KR); JaeMyeong Kim, Incheon (KR); DaAe Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 372 days.

(21) Appl. No.: 18/325,805

(22) Filed: May 30, 2023

(65) Prior Publication Data

US 2024/0404956 A1   Dec. 5, 2024

(51) Int. Cl.
  *H01L 23/538* (2006.01)
  *H01L 21/56* (2006.01)
  (Continued)

(52) U.S. Cl.
  CPC ........ *H01L 23/5385* (2013.01); *H01L 21/565* (2013.01); *H01L 23/3128* (2013.01); *H01L 23/5381* (2013.01); *H01L 23/5389* (2013.01); *H01L 23/66* (2013.01); *H01L 24/16* (2013.01); *H01L 24/32* (2013.01); *H01L 24/48* (2013.01); *H01L 24/73* (2013.01); *H01L 24/81* (2013.01); *H01L 2223/6672* (2013.01);
  (Continued)

(58) Field of Classification Search
  CPC . H01L 2924/19041; H01L 2924/19042; H01L 2924/19043; H01L 21/565; H01L 24/16; H01L 24/32; H01L 24/48; H01L 24/73; H01L 24/81; H01L 2223/6672; H01L 2224/16227; H01L 2224/32225; H01L 2224/48227; H01L 2224/73204; H01L 2224/81815
  See application file for complete search history.

(56) References Cited

U.S. PATENT DOCUMENTS 9,431,371 B2   8/2016   Karikalan et al.
9,642,259 B2   5/2017   Kim et al.
(Continued)

OTHER PUBLICATIONS

Hybrid Bonding Basics, What is Hybrid Bonding, Brewer Science, https://www.brewerscience.com/what-is-hybrid-bonding, 8 pages, downloaded May 17, 2023.

*Primary Examiner* — Peniel M Gumedzoe
(74) *Attorney, Agent, or Firm* — Brian M. Kaufman; Robert D. Atkins; PATENT LAW GROUP: Atkins and Associates, P.C.

(57) ABSTRACT

A semiconductor device has a first substrate. A first semiconductor die and second semiconductor die are disposed over the substrate. An interconnect bridge is disposed over the first semiconductor die and second semiconductor die. The interconnect bridge has a second substrate. A conductive trace is formed over the second substrate. The conductive trace is electrically coupled from the first semiconductor die to the second semiconductor die. An IPD is also formed over the second substrate. The IPD is electrically coupled between the first semiconductor die and second semiconductor die. An encapsulant is deposited over the first substrate, first semiconductor die, second semiconductor die, and interconnect bridge.

21 Claims, 12 Drawing Sheets

(51) Int. Cl.
 *H01L 23/00* (2006.01)
 *H01L 23/31* (2006.01)
 *H01L 23/66* (2006.01)

(52) U.S. Cl.
 CPC .............. *H01L 2224/16227* (2013.01); *H01L 2224/32225* (2013.01); *H01L 2224/48227* (2013.01); *H01L 2224/73204* (2013.01); *H01L 2224/81815* (2013.01); *H01L 2924/19041* (2013.01); *H01L 2924/19042* (2013.01); *H01L 2924/19043* (2013.01)

(56) References Cited

U.S. PATENT DOCUMENTS

| | | | |
|---|---|---|---|
| 11,282,780 | B2 | 3/2022 | Cheah et al. |
| 11,521,932 | B2 | 12/2022 | Chea et al. |
| 2018/0331042 | A1* | 11/2018 | Manusharow ...... H01L 21/4857 |
| 2020/0144186 | A1 | 5/2020 | Thomas et al. |
| 2020/0395300 | A1* | 12/2020 | Xie ..................... H01L 23/5386 |
| 2024/0222320 | A1* | 7/2024 | Nad ........................ H01L 25/18 |
| 2024/0339412 | A1* | 10/2024 | Kuliasha ............ H01L 23/5386 |

* cited by examiner

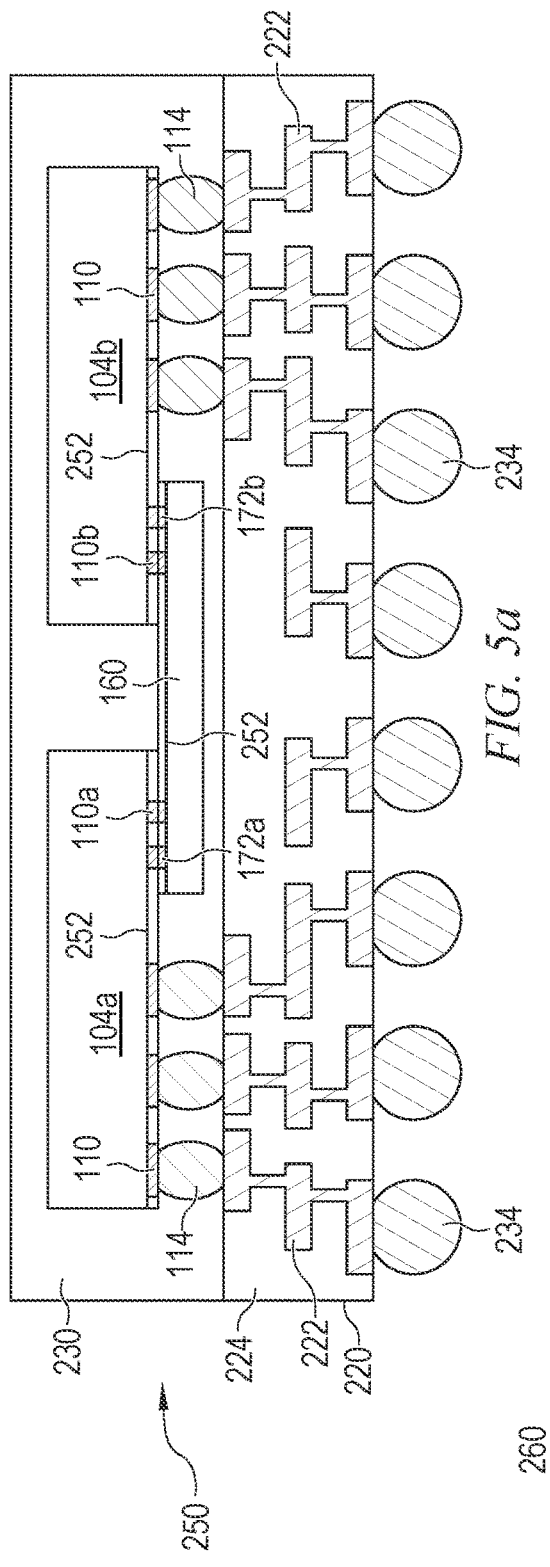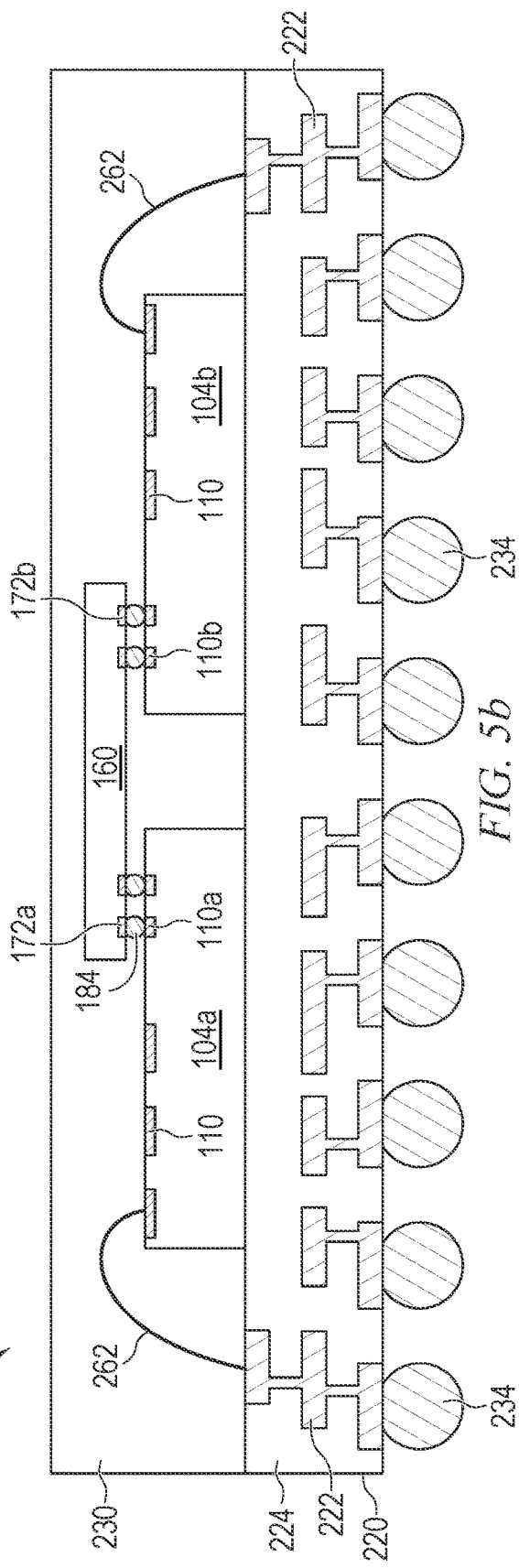

SEMICONDUCTOR DEVICE AND METHOD OF MAKING AN INTERCONNECT BRIDGE WITH INTEGRATED PASSIVE DEVICES

FIELD OF THE INVENTION

The present invention relates in general to semiconductor devices and, more particularly, to a semiconductor device and method of making an interconnect bridge with integrated passive devices.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g., multiple semiconductor die and myriad discrete components to support the semiconductor die, disposed on one or more substrates to perform necessary electrical functions. Such a package is commonly referred to as a system-in-package (SiP) module. SiP modules can be formed with a plurality of semiconductor die interconnected to each other. Interconnecting the plurality of semiconductor die within a SiP module or other semiconductor package is a challenge in the prior art.

Another problem with SiP modules in the prior art is finding sufficient footprint space for all the required passive elements. Integrated passive devices can be formed over the semiconductor die, but there may not be enough footprint space available for all the required passive elements for a given SiP module design. Discrete passive devices require even more footprint outside of the semiconductor die.

BRIEF DESCRIPTION OF THE DRAWINGS

FIGS. 5a-5c illustrate alternative embodiments; and

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
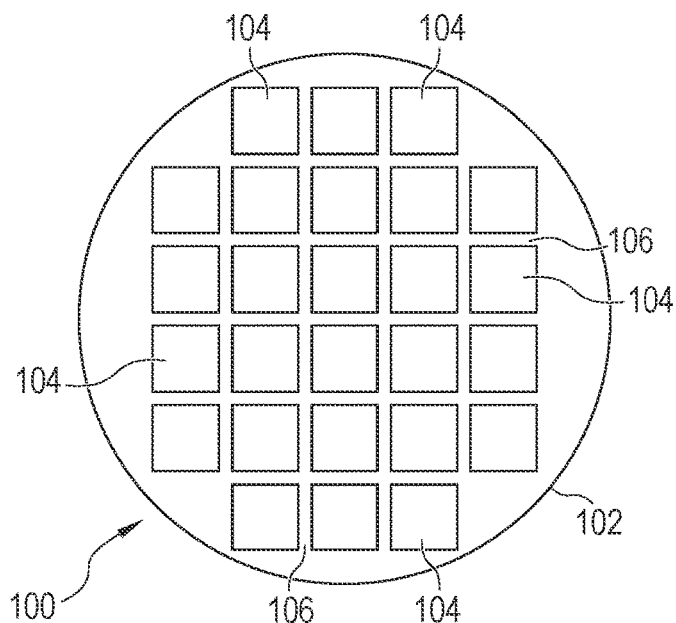
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
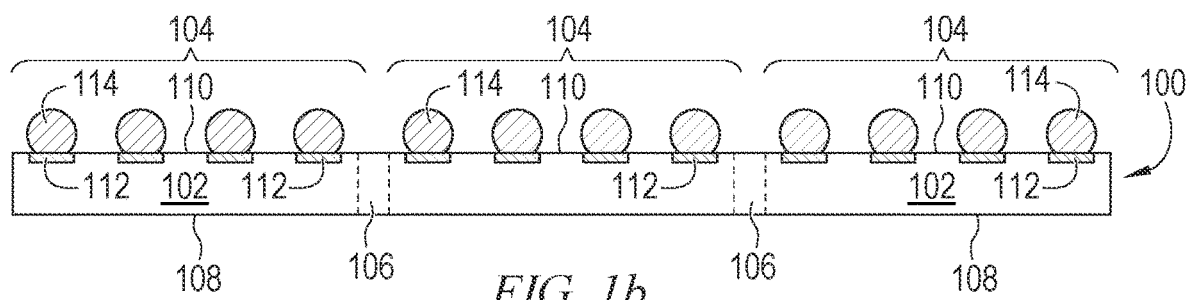

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bumps, micro bumps, or another type of electrical interconnect.

Figure 1C:
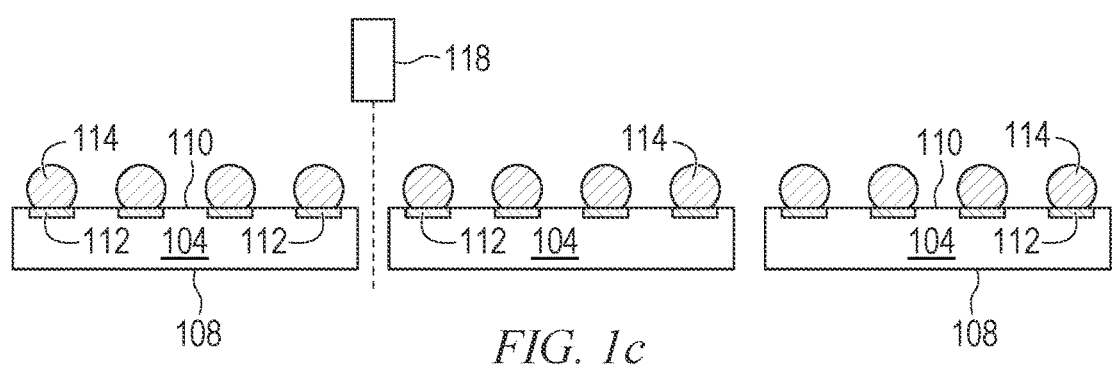

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

FIGS. 2a-2j illustrate forming integrated passive devices (IPDs) and conductive traces over a substrate to manufacture an interconnect bridge. IPDs are referred to as integrated because passive devices are formed over a substrate using common semiconductor manufacturing steps, allowing the IPDs to easily be integrated onto a semiconductor die with other functionality. A silicon substrate 120 is used in FIG. 2a. Substrate 120 can be the same or similar to wafer 100 in FIG. 1a. Substrate 120 may have active devices formed in the silicon material as with active surface 110 above, or the silicon material can be used only as a substrate for the overlying IPDs. Substrate 120 can also be other semiconductor material, aluminum, steel, copper, another metal, glass, polymer, or formed from any other suitable rigid material for structural support of the IPDs being formed.

An insulating layer 122 is formed over substrate 120. Insulating layer 122 contains one or more layers of silicon dioxide (SiO2), silicon nitride (Si3N4), silicon oxynitride (SiON), tantalum pentoxide (Ta2O5), aluminum oxide (Al2O3), solder resist, polyimide (PI), benzocyclobutene (BCB), polybenzoxazoles (PBO), and other material having similar insulating and structural properties. Insulating layers can be formed using PVD, CVD, printing, lamination, spin coating, spray coating, sintering, or thermal oxidation. Openings can be formed through insulating layer 122 to allow electrical connection if active circuit elements were formed in substrate 120.

A conductive layer 124 is formed over insulating layer 122. Conductive layer 124 can be one or more layers of Al, Cu, Sn, Ni, Au, Ag, or other suitable electrically conductive material. Conductive layers can be formed using PVD, CVD, electrolytic plating, electroless plating, or other suitable metal deposition process. Conductive layer 124 provides horizontal electrical interconnect across substrate 120. Portions of conductive layer 124 can be electrically common or electrically isolated depending on the design and function of the package being formed. Conductive layer 124 is deposited into openings of insulating layer 122 to physically and electrically connect to circuit elements in substrate 120, if formed. Conductive layer 124 is patterned using a photolithographic mask, etching after deposition, or selective plating.

Figure 2A:
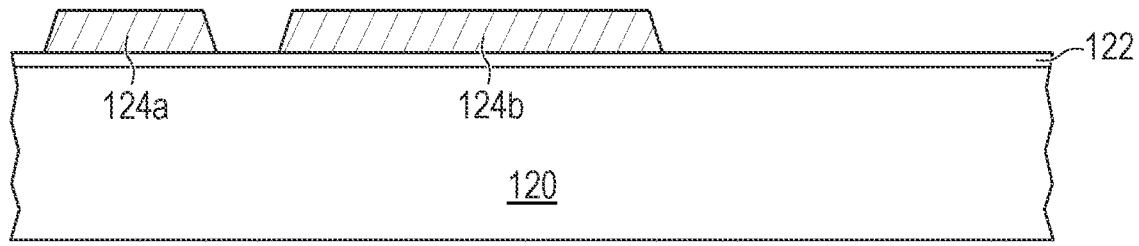
FIGS. 2a-2j illustrate forming an interconnect bridge with integrated passive devices.

Conductive layer 124 is formed in the same manner as a normal metal-1 (M1) layer over a semiconductor die or wafer. Conductive layer 124 is patterned to form integrated passive devices, e.g., shaped in coils to form part of inductors or as a capacitor plate. Portions of conductive layer 124 also form conductive traces across the surface of substrate 120 to act as a redistribution layer (RDL) and contact pads for contact with subsequently formed conductive layers. In particular, portion 124a in FIG. 2a is shaped to form a conductive trace with contact pads at its ends and portion 124b is shaped to form a contact pad connected to a bottom plate of a capacitor. Portions of conductive layer 124 can be shaped as desired to form any suitable circuit elements.

Figure 2B:
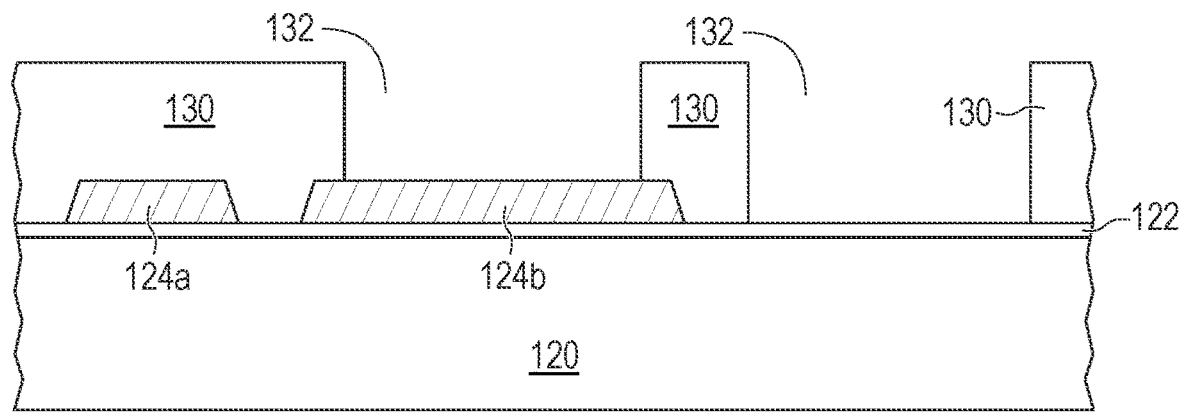
Figure 2C:
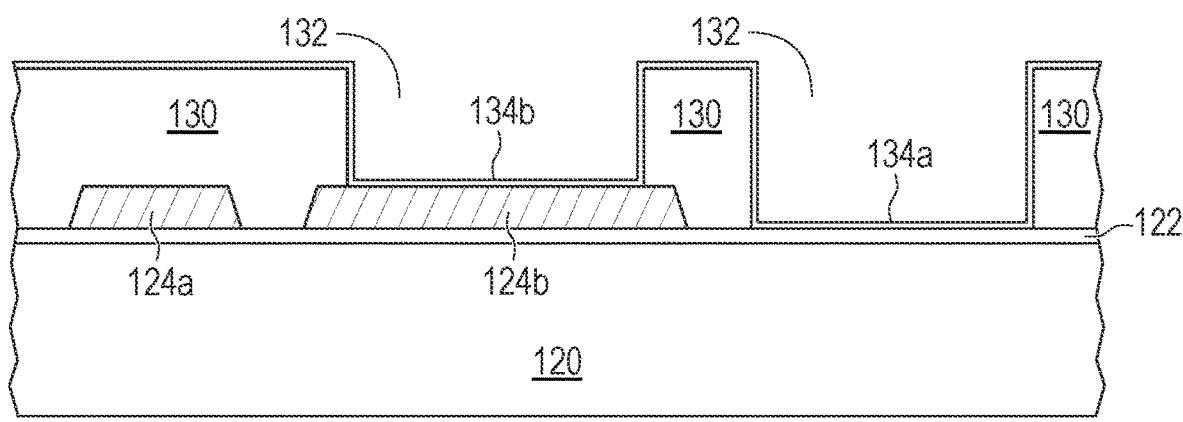

FIG. 2b shows a mask layer 130 formed over substrate 120. Mask layer 130 is a photolithographic mask that is formed completely covering substrate 120 and then developed to allow removal of desired portions to form openings 132. In FIG. 2c, a Tantalum-Silicon (TaSi) layer 134 is formed by depositing the appropriate materials into openings 132. TaSi layer 134 can be deposited using any of the methods discussed above for conductive layer 124. TaSi layer 134 is formed completely covering mask layer 130 and then only the portions on the bottom surfaces in openings 132 remain after removal of the mask. Openings 132 define the shape of TaSi layer 134 that is left in the final product after mask 130 is removed. In other embodiments, TaSi layer 134 is formed covering substrate 120 completely without a mask and then patterned to the desired formations, or selectively formed in the desired pattern.

TaSi layer 134 is used as a layer with a controllable electrical resistance. In FIG. 2b, portion 134a is formed independently to operate as a resistor. Portion 134b is formed on conductive layer portion 124b to form part of the capacitor structure. TaSi layer 134 can be selectively formed using mask 130 with openings 132 into any desired pattern for forming any desired passive components over substrate 120.

Figure 2D:
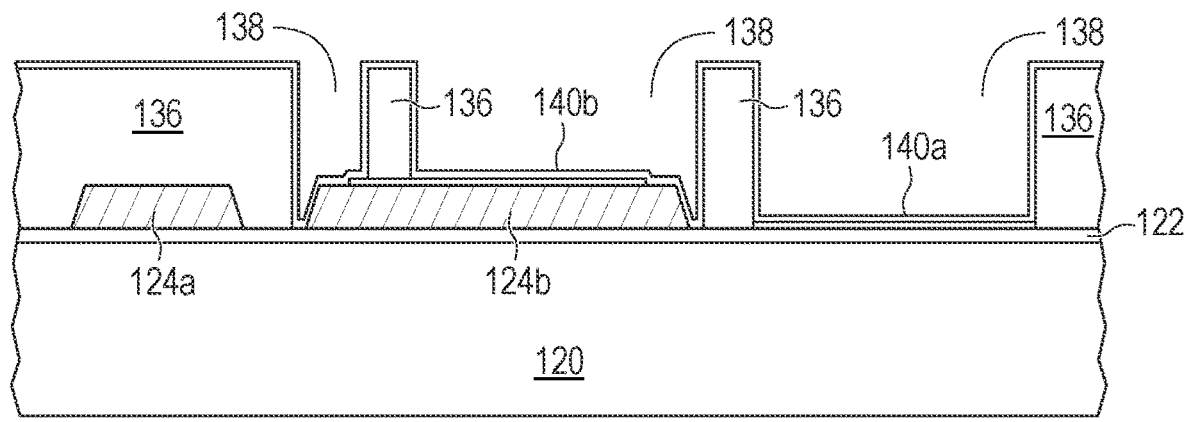
Figure 2E:
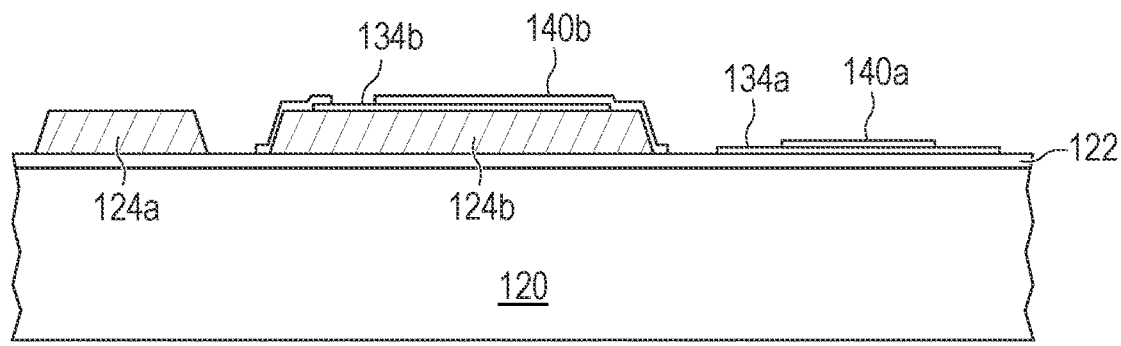

In FIG. 2d, a second mask layer 136 is formed over substrate 120 with openings 138 formed through the mask layer. A nitride layer 140 is formed over mask 136 and into openings 138. Nitride layer 140 remains in the pattern of openings 138 after mask 136 is removed in FIG. 2e. In other embodiments, nitride layer 140 is formed covering substrate 120 completely without a mask and then patterned to the desired formations, or selectively formed in the desired pattern.

Nitride layer portion 140b is an insulating layer that operates as a dielectric layer over the capacitor plate of conductive layer portion 124b. Nitride layer portion 140a provides a protective layer over the resistor formed by TaSi layer portion 134a. Nitride layer 140 can be formed in any suitable pattern to create the desired electrical components.

Figure 2F:
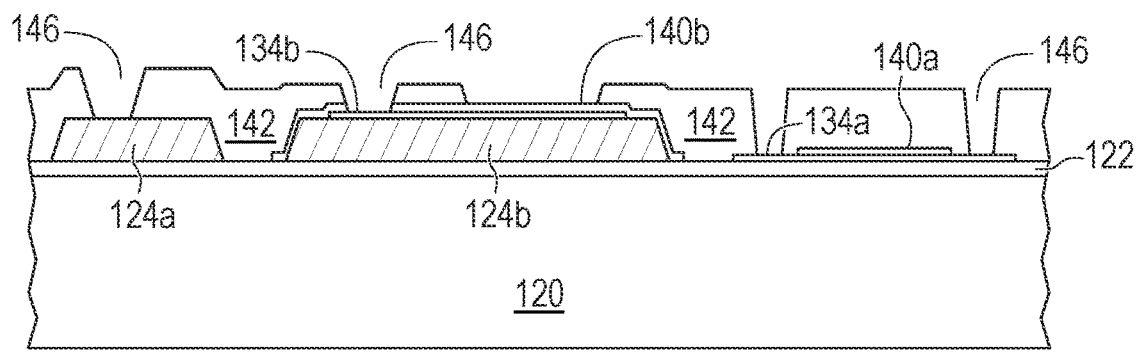

Insulating layer 142 is formed over substrate 120 in FIG. 2f. Openings 146 are formed through insulating layer 142 to expose underlying elements for electrical interconnect. Insulating layer 142 can be formed as discussed above for insulating layer 120 and patterned using photolithography or another suitable means. Insulating layer 142 is a PI layer in one embodiment.

Figure 2G:
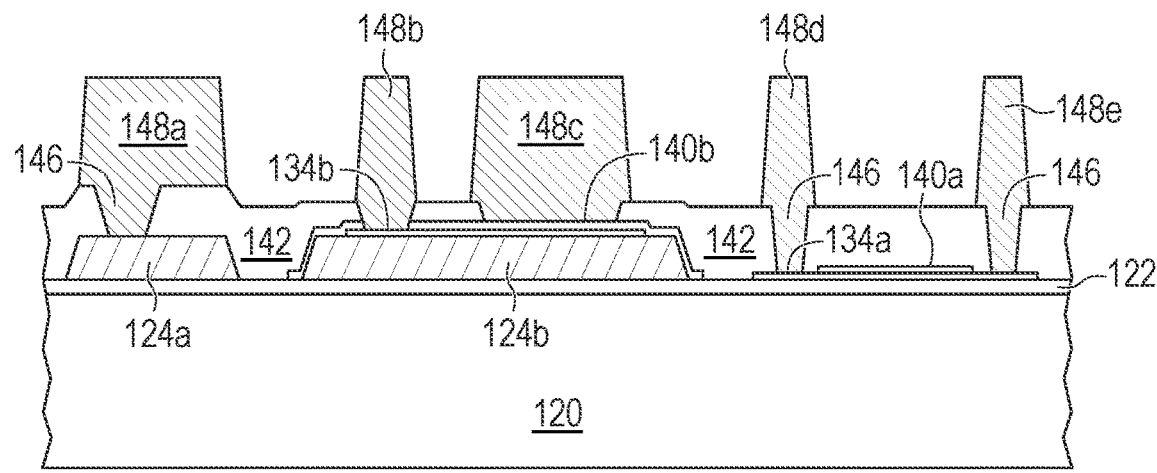

In FIG. 2g, a conductive layer 148 is formed over insulating layer 142, including extending into openings 146. Conductive layer 148 is formed and patterned as discussed above for conductive layer 124. Portion 148a operates as a contact pad for the conductive trace of conductive layer portion 124a. Portions 148b and 148c operate as contact pads for the underlying capacitor. Portions 148d and 148e operate as contact pads for the underlying resistor. Conductive layer 148 can be patterned into contact pads, conductive traces, and other structures to implement the desired electrical functionality.

Figure 2H:
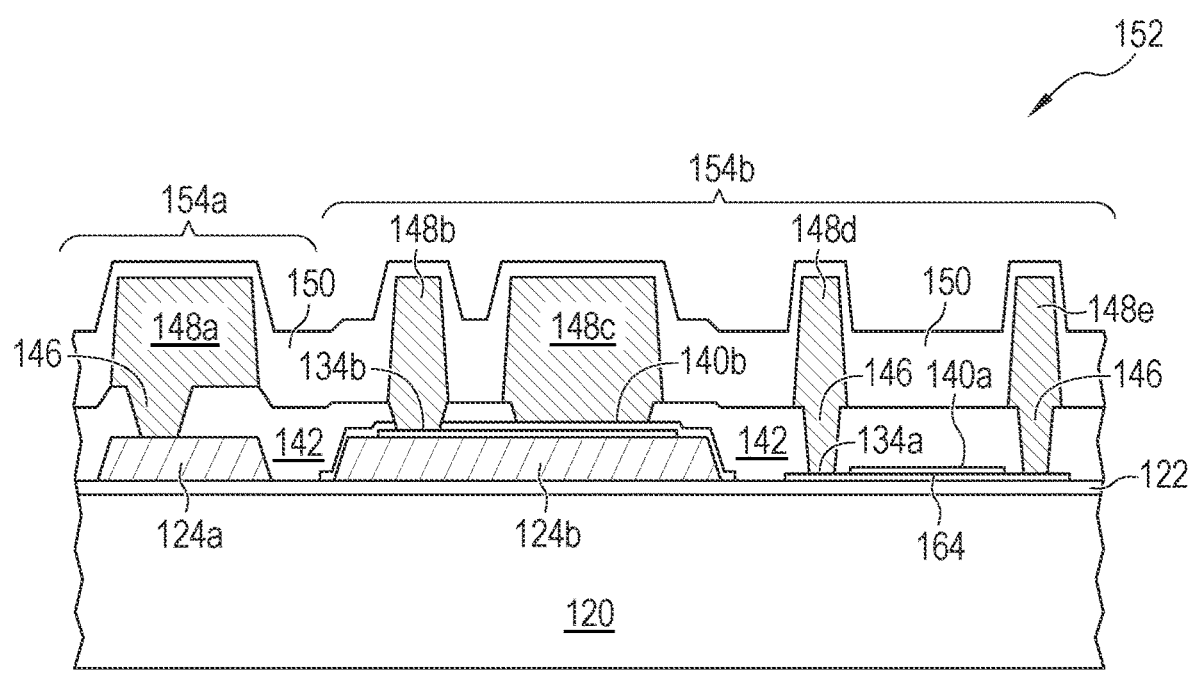

Insulating layer 150 is formed over conductive layer 148 in FIG. 2h to complete an interconnect bridge 152. Insulating layer 150 is formed as described above for insulating layer 142. Insulating layer 150 is a PI layer in one embodiment. Openings are formed through insulating layer 150 to expose contact pads of conductive layer 148 where needed for electrical interconnect.

Interconnect bridge 152 is so named because it is designed to operate as RDL between multiple semiconductor die or other electrical components. Interconnect bridge 152 has contact pads 172a grouped toward one edge of substrate 120 to connect to a first semiconductor die and contact pads 172b grouped toward an opposite edge to connect to a second semiconductor die.

Figure 2I:
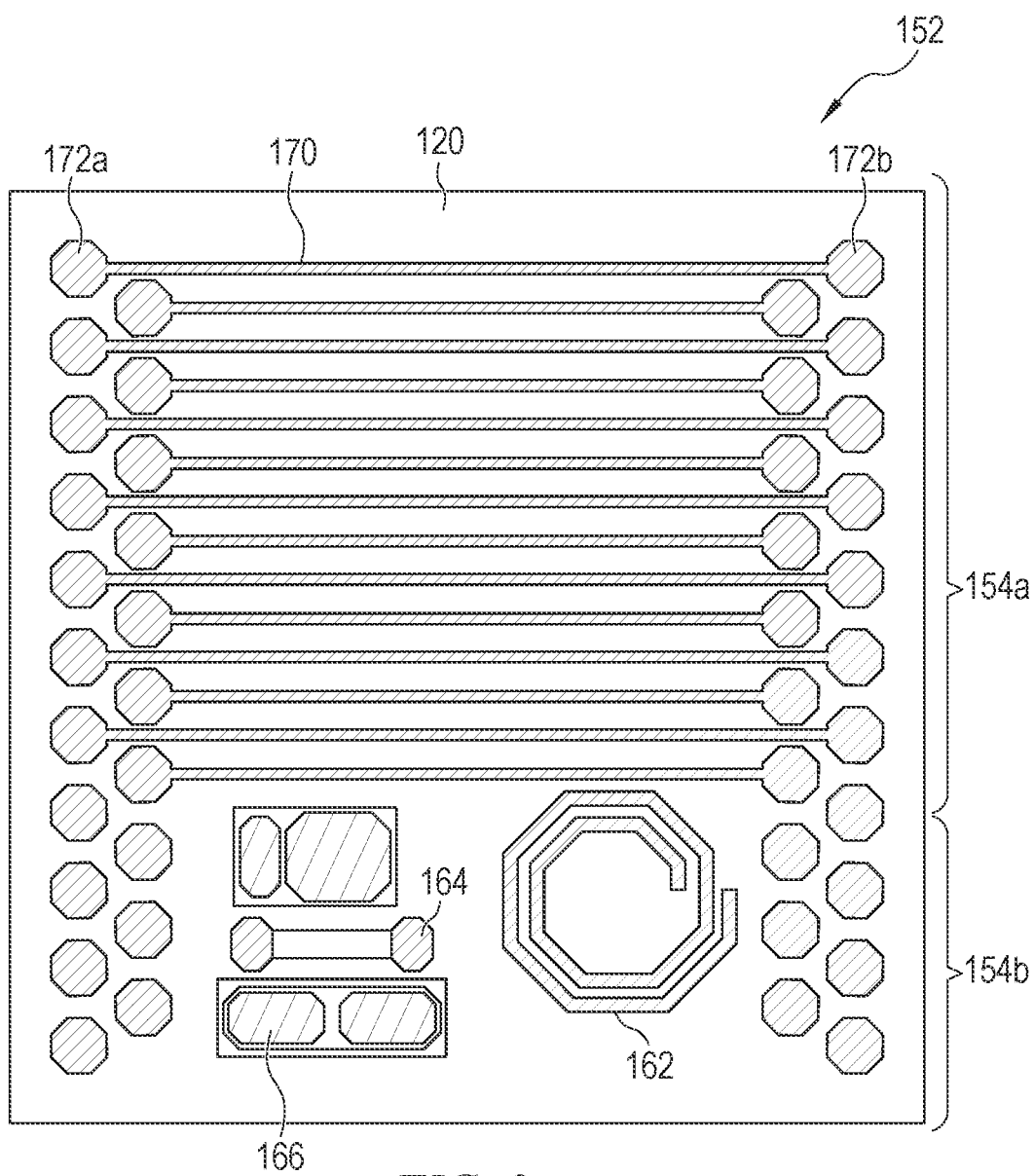

Interconnect bridge 152 includes a first region 154a with conductive traces formed to directly interconnect two adjacent semiconductor die and a second region 154b with IPDs to process signals between the two semiconductor die. FIG. 2i shows a plan view in one embodiment. Inductor 162, resistor 164, and capacitors 166, collectively referred to as IPDs 162-166, are coupled between contact pads 172a on one side of interconnect bridge 152 and contact pads 172b on the opposite side. While the specific electrical connections of IPDs 162-166 are not shown, the IPDs can form any desired passive network across interconnect bridge 152, e.g., an RLC matching circuit, RF filter, balun, etc. IPDs 162-166 are formed by conductive layer 124, TaSi layer 134, nitride layer 140, and conductive layer 148c. Conductive traces 170 and contact pads 172 are formed by conductive layer 124, conductive layer 148, or both.

Figure 2J:
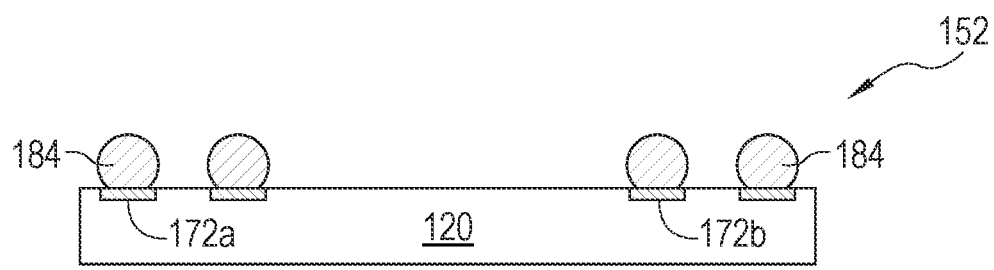

FIG. 2j shows a side view of interconnect bridge 152 with contact pads 172a and 172b formed on opposite sides of the interconnect bridge. Bumps 184 are formed on contact pads 172 as described above for bumps 114 on pads 112. Interconnect bridge 152 is mounted onto two adjacently placed semiconductor die to electrically connect the two die together. Conductive traces 170 provide RDL between the two die. IPDs 162-166 add passive devices on the same substrate as the conductive traces connecting two devices together, thus reducing the need for external discrete passive components or IPDs on the two die being connected by interconnect bridge 152. The layers of interconnect bridge 152 are typically formed with substrate 120 at the wafer level, and then the substrate is singulated into individual interconnect bridges.

Figure 3:
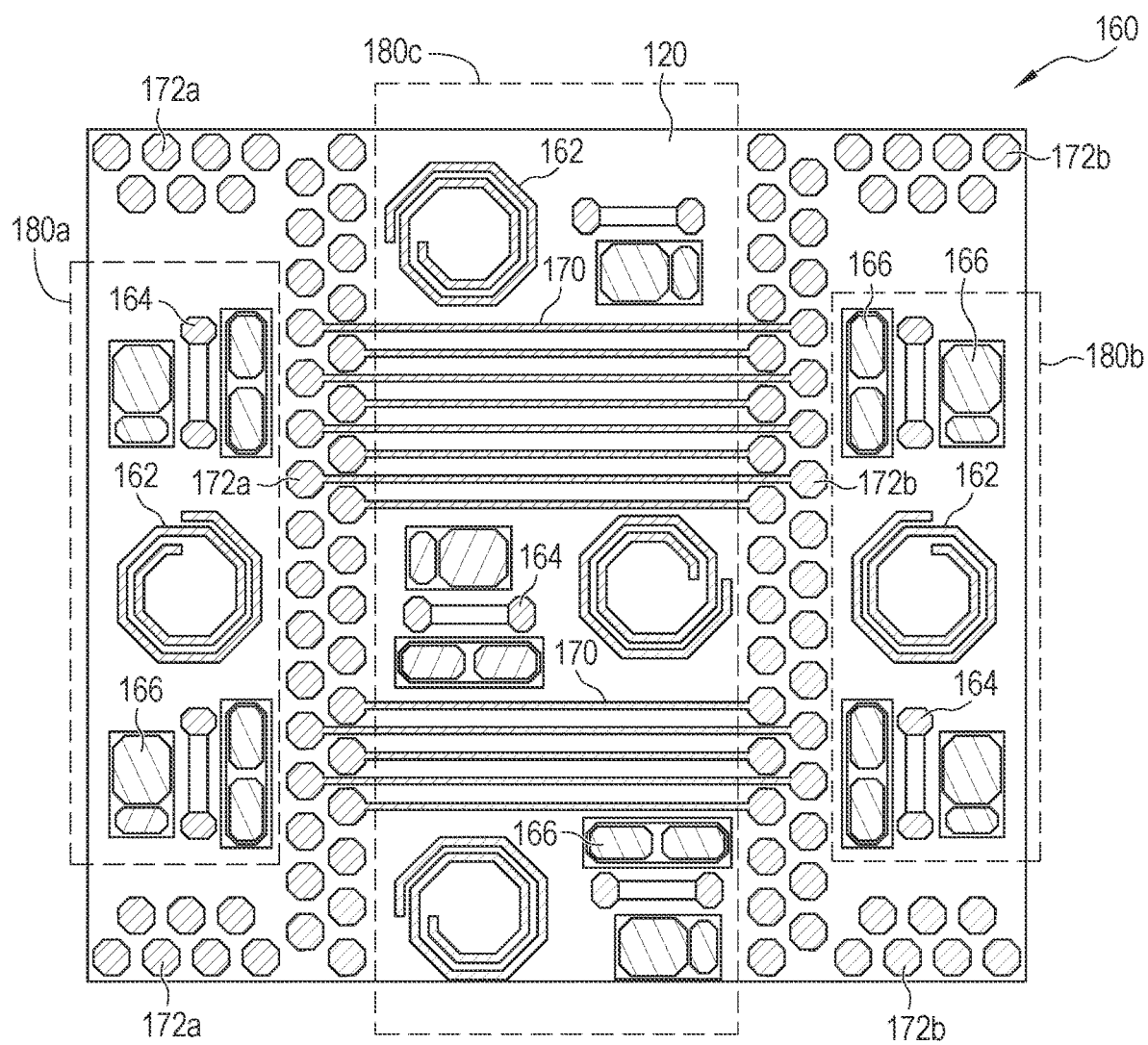
FIG. 3 illustrates an advanced embodiment.

FIG. 3 shows another example layout of an interconnect bridge 160 formed in accordance with the above description and FIGS. 2a-2h. Conductive layer 124, TaSi layer 134, nitride layer 140, and conductive layer 148 are patterned to form any number of inductors 162, resistors 164, capacitors 166, conductive traces 170, contact pads 172, and other electrical elements needed to implement the electrical functionality desired for an end device. Any of the conductive elements illustrated in FIG. 3 can be formed as part of conductive layer 124, conductive layer 148, or both. Resistors 164 and capacitors 166 utilize portions of TaSi layer 134 and nitride layer 140 as described above.

IPDs 162-166 are grouped into three different regions 180a-180c. Group 180a is formed near contact pads 172a and provides passive functionality specifically needed for or useful with the semiconductor die to be coupled to contact pads 172a. IPDs 162-166 within group 180a each have electrical terminals coupled directly or indirectly to contact pads 172a. As a group, the IPDs within group 180a are directly coupled to contact pads 172a but not contact pads 172b. Similarly, IPDs 162-166 within group 180b are formed near contact pads 172b and are specifically for use with a semiconductor die or other electrical component coupled to contact pads 172b. Group 180b is directly coupled to contact pads 172b but not contact pads 172a. IPDs 162-166 in group 180c are disposed between contact pads 172a and 172b and are designed to process signals going between the two connected semiconductor die. IPDs 162-166 within group 180c will have terminals electrically coupled to both contact pads 172a and 172b. As a group, the IPDs of group 180c are directly coupled to both contact pads 172a and 172b.

The areas of groups 180a-180c are just for example. The individual groupings can be split up between multiple areas, IPDs 162-166 from different groups 180 can be disposed adjacent to each other, IPDs from groups 180a and 180b can be disposed between contact pads 172a and 172b while only being electrically connected to one side, etc.

Group 180c, in addition to having IPDs 162-166 that couple the contact pads 172a and 172b to each other, also has conductive traces 170 that directly electrically connect contact pads 170a and 170b to each other. Interconnect bridge 160 is a combination unit that provides electrical signal routing between two different semiconductor die, IPDs for processing signals between the two different semiconductor die, and IPDs specific to each individual semiconductor die of the two different semiconductor die.

Figure 4A:
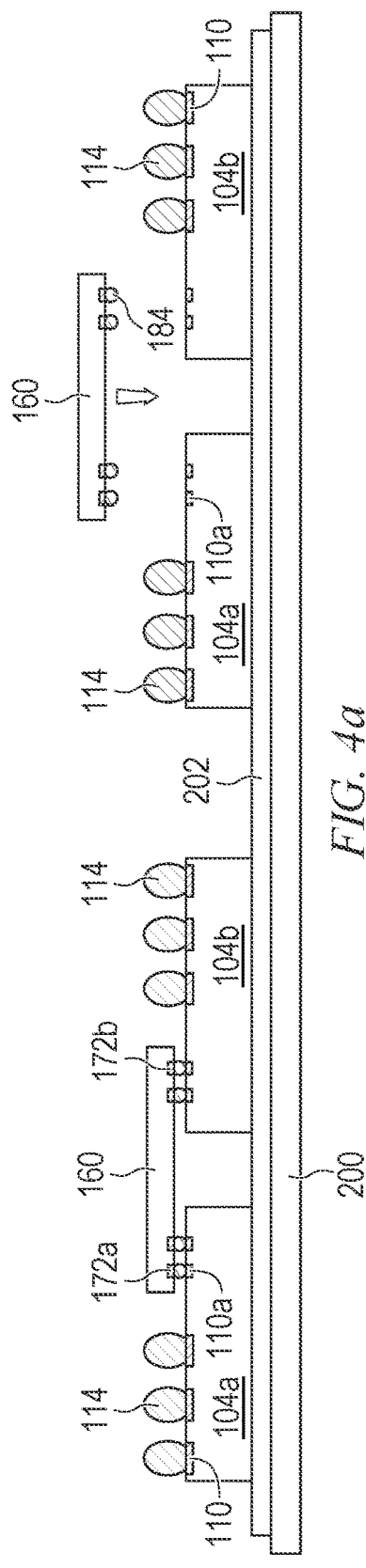
FIGS. 4a-4d illustrate forming a SiP module or semiconductor package with multiple semiconductor die connected to each other by the interconnect bridge.

FIGS. 4a-4d illustrate forming semiconductor packages with two semiconductor die 104 connected by interconnect bridge 160. Interconnect bridge 152 or another embodiment with any combination of components coupled between or to contact pads 172a and 172b can be used as well. In FIG. 4a, semiconductor die 104 are picked and placed onto a carrier or temporary substrate 200 containing sacrificial base material such as silicon, polymer, beryllium oxide, glass, or other suitable low-cost, rigid material for structural support. An interface layer or double-sided tape 202 is formed or disposed over carrier 200 as a temporary adhesive bonding film, thermal release layer, or UV release layer. Carrier 200 can be a round or rectangular panel with capacity for forming multiple packages at once. While only two units are illustrated being formed, hundreds, thousands, or more modules may be formed together on a common carrier 200.

Each package being formed includes two semiconductor die 104a and 104b. Semiconductor die 104a and 104b can be identical to each other and operate in tandem, or be different semiconductor die with cooperative functionality. Some of the contact pads 110, identified with the reference number 110a, remain without bumps 114. Semiconductor die 104a and 104b are placed so that the edges with contact pads 110a are oriented toward each other so that interconnect bridge 160 can be picked and placed onto the semiconductor die with bumps 184 aligned to pads 110a of both die. Bumps 184 are reflowed to mechanically and electrically attach interconnect bridge 160 to semiconductor die 104a and 104b.

Figure 4B:
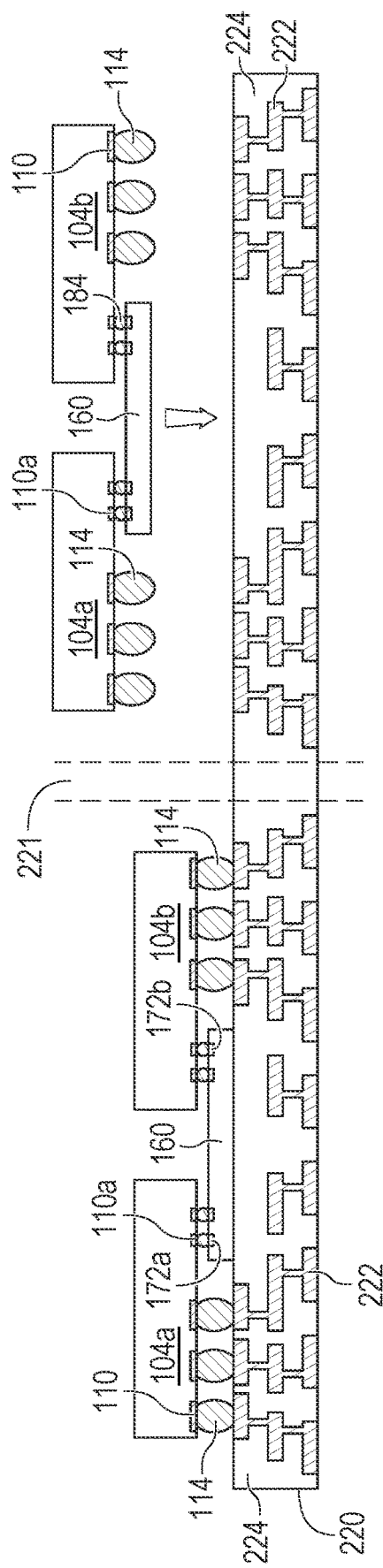

In FIG. 4b, the structure of semiconductor die 104a, semiconductor die 104b, and interconnect bridge 160, which was formed in FIG. 4a, is flipped and disposed over a package substrate 220. Substrate 220 is a multi-layered interconnect substrate including conductive layers 222 and insulating layers 224. While only a single substrate 220 suitable to form two semiconductor packages separated by saw street 221 is shown, hundreds or thousands of units are commonly manufactured on, and processed as part of, a single substrate before being singulated from each other, using the same steps described herein performed en masse. A separate substrate 220 could also be used for each package being manufactured, the substrate being singulated before the steps shown in FIGS. 4b-4d and a plurality of individual substrates being placed on a common carrier for processing.

Conductive layers 222 can be one or more layers of Al, Cu, Sn, Ni, Au, Ag, or other suitable electrically conductive material. Conductive layers 222 can be formed using PVD, CVD, electrolytic plating, electroless plating, or other suitable metal deposition process. Conductive layers 222 provide horizontal electrical interconnect across substrate 220 and vertical electrical interconnect between top and bottom surfaces. Portions of conductive layers 222 can be electrically common or electrically isolated depending on the design and function of the package being formed.

Insulating layers 224 contain one or more layers of SiO2, Si3N4, SiON, Ta2O5, Al2O3, solder resist, PI, BCB, PBO, and other material having similar insulating and structural properties. Insulating layers 224 can be formed using PVD, CVD, printing, lamination, spin coating, spray coating, sintering, thermal oxidation, or another suitable process. Insulating layers 224 provide isolation between conductive layers 222. Any number of conductive layers 222 and insulating layers 224 can be interleaved over each other to form substrate 220. Any other suitable type of package substrate or leadframe is used for substrate 220 in other embodiments.

Bumps 114 are reflowed onto contact pads of conductive layer 222 to physically and electrically connect the combination of semiconductor die 104a, semiconductor die 104b, and interconnect bridge 160 to substrate 220. A back surface of interconnect bridge 160 may rest on the top surface of substrate 220, or a gap may remain. Any additional electrical components can be mounted on the top or bottom surface of substrate 220 as desired to add to the functionality of the package. The additional components can be discrete active or passive devices, additional integrated circuit semiconductor die, antennae, connectors, or any other suitable electrical component.

Figure 4C:
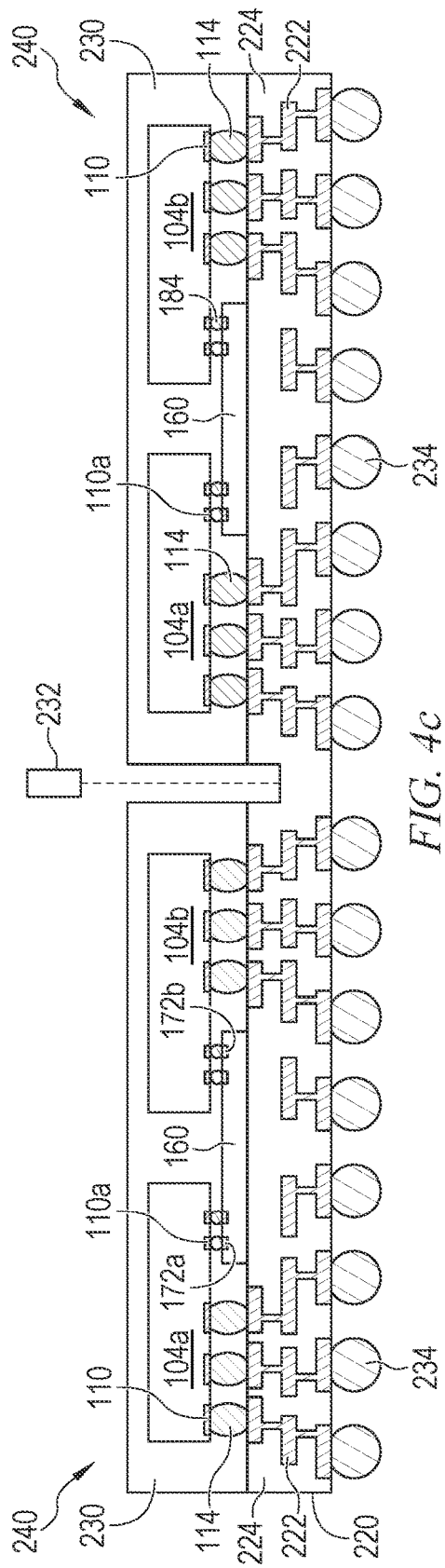

In FIG. 4c, encapsulant or molding compound 230 is deposited over and around substrate 220, semiconductor die 104a, semiconductor die 104b, and interconnect bridge 160 using a paste printing, compressive molding, transfer molding, liquid encapsulant molding, vacuum lamination, spin coating, or another suitable applicator. Encapsulant 230 can be liquid or granular polymer composite material, such as epoxy resin, epoxy acrylate, or polymer, with or without a filler. Encapsulant 230 is non-conductive, provides structural support, and environmentally protects the semiconductor device from external elements and contaminants.

Substrate 220 is flipped, and bumps 234 are mounted onto the bottom surface of the substrate opposite semiconductor die 104. Bumps 234 are formed as described above for bumps 114 of semiconductor die 104. Bumps 234 can be disposed on substrate 220 at any stage of the manufacturing process. FIG. 4c also shows substrate 220 and encapsulant 230 singulated through saw street 221 using saw blade or laser cutting tool 232 into individual semiconductor packages 240. A shielding layer is optionally formed over packages 240 by sputtering.

Figure 4D:
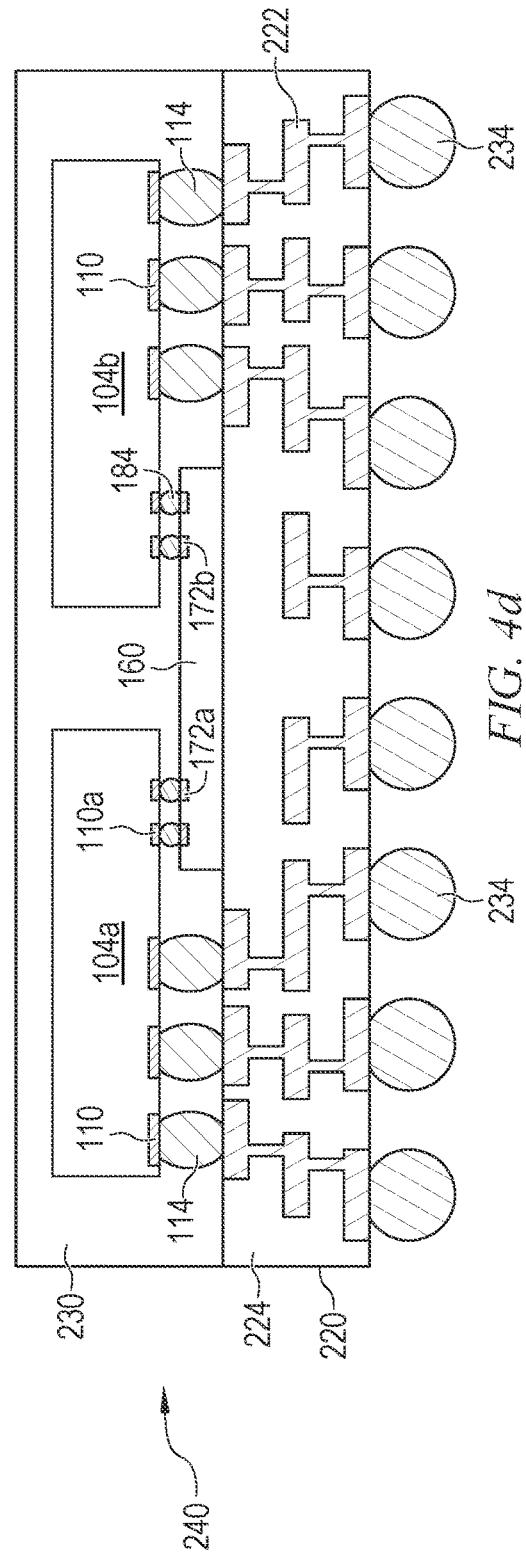

FIG. 4d shows a completed package 240 with two semiconductor die 104a and 104b connected by interconnect bridge 160. Interconnect bridge 160 includes IPDs usable individually by semiconductor die 104a and semiconductor die 104b, as well as to process signals between the two die. Interconnect bridge 160 provides significant footprint area for IPDs, which may be limited on the surfaces of semiconductor die 104a and 104b due to signal routing requirements and other logistical issues. Using the same process of forming IPDs to also interconnect semiconductor die 104a and 104b reduces cost and total manufacturing complexity. Both IPD and RDL interconnection are manufactured using a single IPD wafer.

Figure 5C:
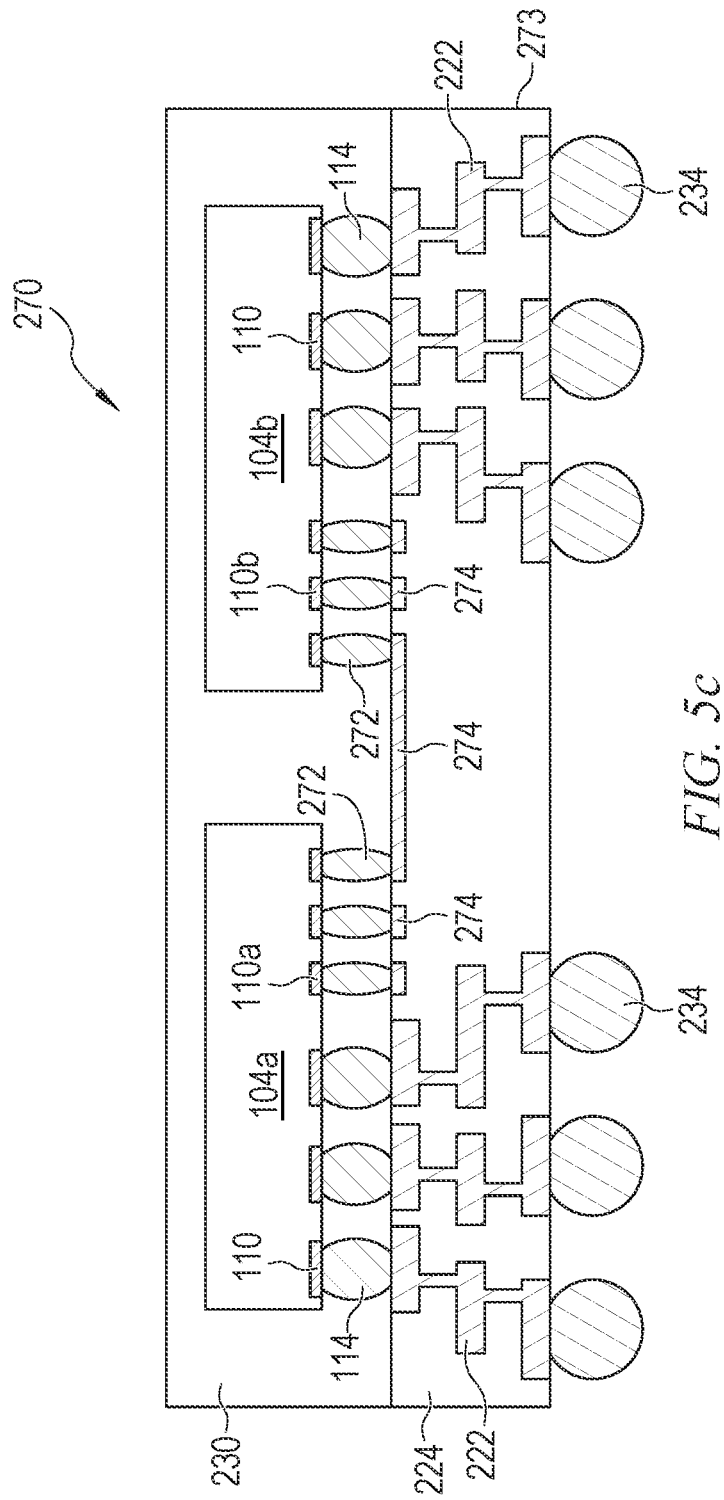

FIGS. 5a-5c illustrate additional embodiments for the interconnections between semiconductor die 104 and interconnect bridge 160. In FIG. 5a, package 250 has semiconductor die 104 connected to interconnect bridge 160 by hybrid bonding. Hybrid bonding allows direct bonding between contact pads of the devices. Interconnect bridge 160 is placed on top of two adjacent semiconductor die 104 as shown in FIG. 4a, but without bumps 184 present. The top insulating layer 252 of interconnect bridge 160 physically sets directly on the top insulating layers of semiconductor die 104. The opposing insulating layers 252 bond together at room temperature to physically attach interconnect bridge 160 to semiconductor die 104a and 104b. Once the insulating layers are bonded together, the combination is heated. Contact pads 110a and 172a expand more than insulating layers 252, thus pressing the contact pads into each other and bonding them together. Other types of thermocompression or hybrid bonding are used in other embodiments. The thermocompression or hybrid bonding is a replacement for solder bumps 184 from FIG. 4d.

FIG. 5b shows an embodiment as semiconductor package 260 with semiconductor die 104 connected to substrate 220 by bond wires 262 instead of bumps 114. Bumps 114 are not formed on semiconductor die 104 as shown in FIG. 1c. Instead, contact pads 112 remain exposed for subsequent bond wire attachment. Interconnect bridge 152 or 160 is mounted to a pair of semiconductor die 104a and 104b as illustrated in FIG. 4a or 5a. The combination of interconnect bridge 160 and semiconductor die 104 is then disposed over substrate 220 with back surfaces of the semiconductor die directly on the substrate. Any suitable wire bonding method is used to electrically couple contact pads 110 of semiconductor die 104 to conductive layer 222 of substrate 220. Interconnect bridge 160 provides electrical connection between semiconductor die 104a and 104b and adds IPD functionality as well.

FIG. 5c illustrates an embodiment where semiconductor package 270 has semiconductor die 104 with bumps 272 connecting contact pads 110a and 110b directly to substrate 273. Conductive layers 274 of substrate 273 provide both interconnect between semiconductor die 104 and also IPDs formed as shown in FIGS. 2a-2j and FIG. 3. IPDs can be formed on or in substrate 273 in the same manner as formed on substrate 120 in FIGS. 2a-2h.

Figure 6A:
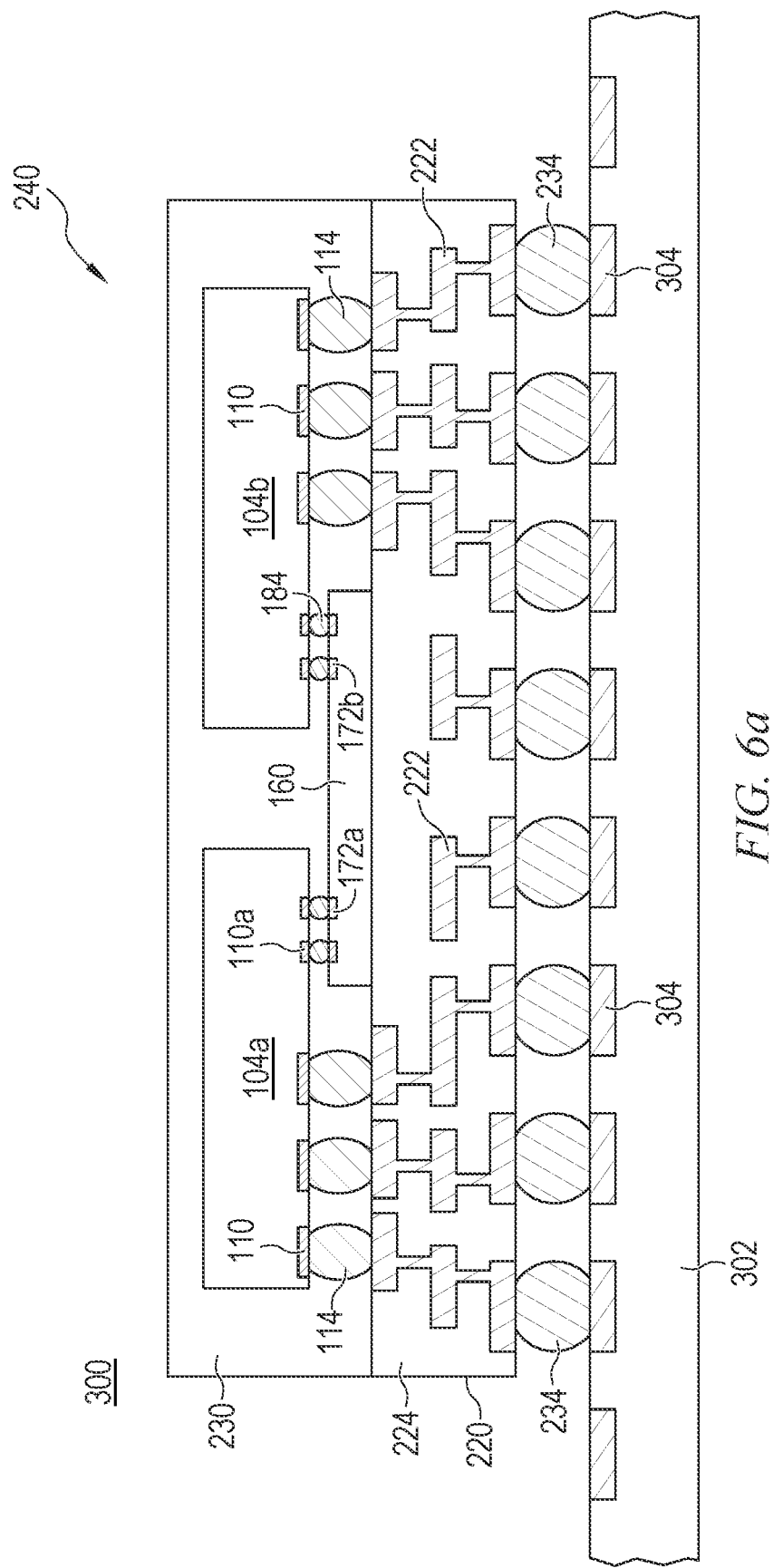
FIGS. 6a and 6b illustrate an electronic device with different types of packages disposed on a printed circuit board (PCB).
Figure 6B:
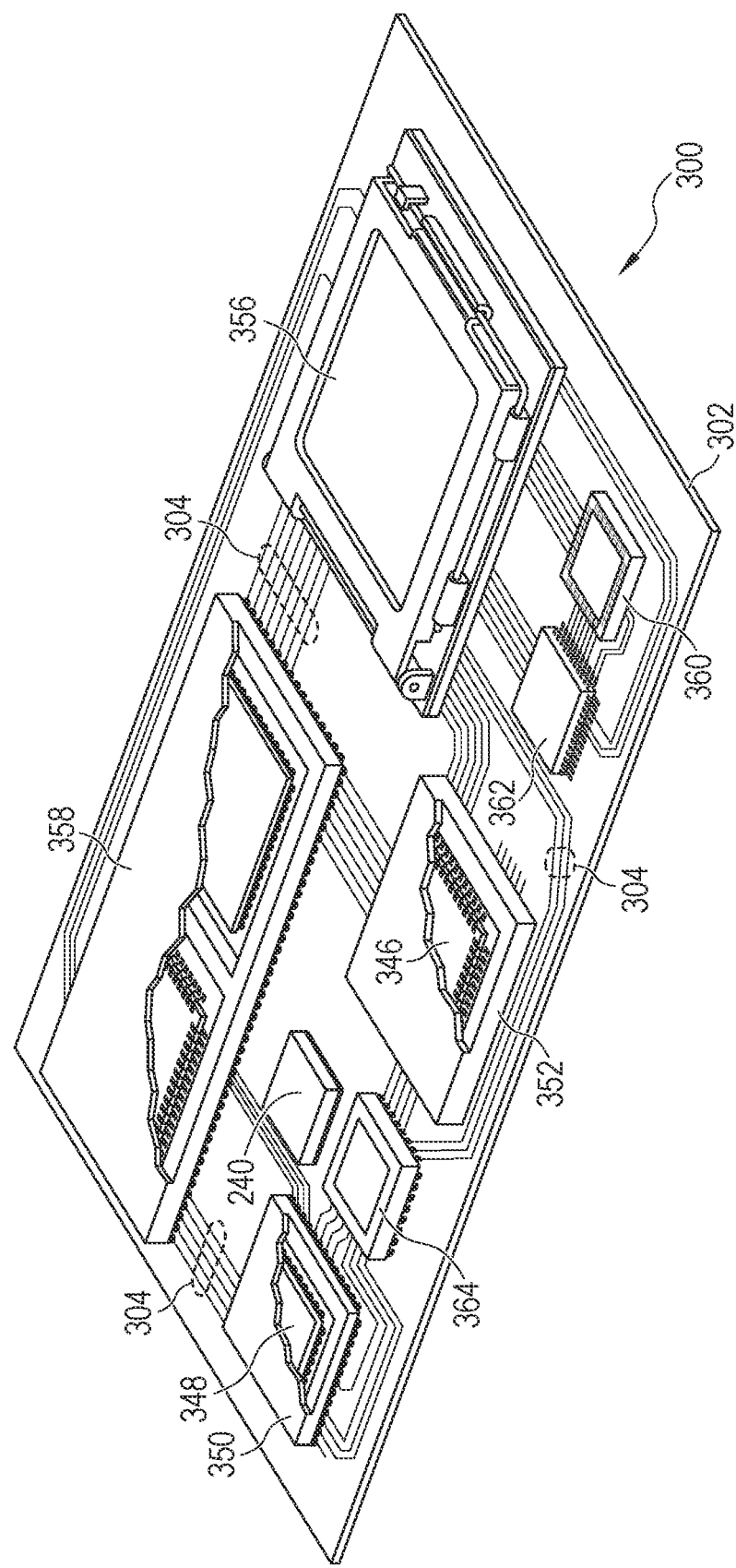

FIGS. 6a and 6b illustrate integrating the above-described semiconductor packages and devices, e.g., semiconductor package 240, into a larger electronic device 300. FIG. 6a illustrates a partial cross-section of semiconductor package 240 mounted onto a printed circuit board (PCB) or other substrate 302 as part of electronic device 300. Bumps 234 are reflowed onto conductive layer 304 of PCB 302 to physically attach and electrically connect semiconductor package 240 to the PCB. In other embodiments, thermocompression or other suitable attachment and connection methods are used. In some embodiments, an adhesive or underfill layer is used between semiconductor package 240 and PCB 302. Semiconductor die 104 are electrically coupled to conductive layer 304 through bumps 234 and substrate 220.

FIG. 6b illustrates electronic device 300 having a chip carrier substrate or PCB 302 with a plurality of semiconductor packages disposed on a surface of PCB 302, including semiconductor package 240. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASICs, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 302 may have a more irregular shape to fit conveniently into more ergonomic and smaller device shells.

In FIG. 6b, PCB 302 provides a general substrate for structural support and electrical interconnect of the semiconductor packages disposed on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) or SIP module 358, quad flat non-leaded package (QFN) 360, quad flat package 362, and embedded wafer level ball grid array (eWLB) 364 are shown disposed on PCB 302. In one embodiment, eWLB 364 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first substrate;
a first semiconductor die disposed over the first substrate;
a second semiconductor die disposed over the first substrate;
an interconnect bridge disposed over the first semiconductor die and second semiconductor die, wherein the interconnect bridge includes,
a second substrate,
a conductive trace formed over the second substrate and electrically coupled from the first semiconductor die to the second semiconductor die,
a first integrated passive device (IPD) formed over the second substrate and electrically coupled between the first semiconductor die and second semiconductor die, and
a second IPD formed over the second substrate, wherein the second IPD is coupled to the first semiconductor die but not the second semiconductor die; and
an encapsulant deposited over the first substrate, first semiconductor die, second semiconductor die, and interconnect bridge.

2. The semiconductor device of claim 1, further including:
a first solder bump disposed between the first semiconductor die and interconnect bridge; and
a second solder bump disposed between the second semiconductor die and interconnect bridge.

3. The semiconductor device of claim 1, wherein the interconnect bridge is hybrid bonded to the first semiconductor die and second semiconductor die.

4. The semiconductor device of claim 1, wherein the second substrate comprises a silicon substrate.

5. The semiconductor device of claim 1, wherein the first IPD includes a resistor, capacitor, or inductor.

6. A semiconductor device, comprising:
a first semiconductor die;
a bond wire extending from the first semiconductor die;
a second semiconductor die; and
an interconnect bridge disposed over the first semiconductor die and second semiconductor die, wherein the interconnect bridge includes,
a substrate,
a conductive trace formed over the substrate and electrically coupled from the first semiconductor die to the second semiconductor die, and an integrated passive device (IPD) formed over the substrate and electrically coupled between the first semiconductor die and second semiconductor die.

7. The semiconductor device of claim 6, wherein the interconnect bridge is hybrid bonded to the first semiconductor die and second semiconductor die.

8. The semiconductor device of claim 6, further including:
a first solder bump disposed between the first semiconductor die and interconnect bridge; and
a second solder bump disposed between the second semiconductor die and interconnect bridge.

9. The semiconductor device of claim 6, further including a second IPD formed over the substrate, wherein the second IPD is coupled to the first semiconductor die but not the second semiconductor die.

10. The semiconductor device of claim 6, wherein the substrate comprises a silicon substrate.

11. The semiconductor device of claim 6, wherein the integrated passive device includes a resistor, capacitor, or inductor.

12. A method of making a semiconductor device, comprising:
providing a first electrical component;
disposing a second electrical component adjacent to the first electrical component;
forming an interconnect bridge by,
providing a substrate,
forming a conductive trace over the substrate,
forming a first integrated passive device (IPD) over the substrate, and
forming a second IPD over the substrate, wherein the second IPD is electrically coupled to the first electrical component but not the second electrical component; and
disposing the interconnect bridge over the first electrical component and second electrical component.

13. The method of claim 12, further including attaching the interconnect bridge to the first electrical component and second electrical component using hybrid bonding.

14. The method of claim 12, wherein the substrate comprises a silicon substrate.

15. The method of claim 12, wherein the first IPD includes a resistor, capacitor, or inductor.

16. The method of claim 12, further including:
disposing the first electrical component, second electrical component, and interconnect bridge over a second substrate; and
forming a bond wire from the second substrate to the first electrical component.

17. A semiconductor device, comprising:
a first electrical component;
a second electrical component disposed adjacent to the first electrical component; and
an interconnect bridge disposed over the first electrical component and second electrical component, wherein the interconnect bridge includes,
a substrate,
a conductive trace formed over the substrate,
a first integrated passive device (IPD) formed over the substrate, and
a second IPD formed over the substrate, wherein the second IPD is electrically coupled to the first electrical component but not the second electrical component.

18. The semiconductor device of claim 17, wherein the interconnect bridge is attached to the first electrical component and second electrical component using hybrid bonding.

19. The semiconductor device of claim 17, wherein the substrate comprises a silicon substrate.

20. The semiconductor device of claim 17, wherein the first IPD includes a resistor, capacitor, or inductor.

21. The semiconductor device of claim 17, further including:
a second substrate, wherein the first electrical component, second electrical component, and interconnect bridge are disposed over the second substrate; and
a bond wire formed from the second substrate to the first electrical component.

* * * * *